(12) United States Patent
Ross

(10) Patent No.: US 6,831,005 B1
(45) Date of Patent: Dec. 14, 2004

(54) ELECTRON BEAM PROCESS DURING DAMASCENE PROCESSING

(75) Inventor: Matthew F. Ross, San Diego, CA (US)

(73) Assignee: Allied Signal, Inc., Morristown, NJ (US)

(*) Notice: Subject to any disclaimer, the term of this patent is extended or adjusted under 35 U.S.C. 154(b) by 610 days.

(21) Appl. No.: 09/690,649

(22) Filed: Oct. 17, 2000

Related U.S. Application Data

(62) Division of application No. 09/270,536, filed on Mar. 17, 1999.

(51) Int. Cl.[7] .......................................... H01L 21/4763
(52) U.S. Cl. ........................ 438/633; 438/618; 438/669; 438/672; 438/723; 438/743; 438/751; 438/752
(58) Field of Search ................................ 438/633, 618, 438/669, 702, 751, 752, 762, 723, 672, 743; 216/65, 66, 80, 97; 428/447, 448, 450

(56) References Cited

U.S. PATENT DOCUMENTS

| | | | |
|---|---|---|---|
| 5,739,579 A | 4/1998 | Chiang et al. ............. 257/635 |
| 5,801,094 A | 9/1998 | Yew et al. ................. 438/624 |
| 5,936,707 A | 8/1999 | Nguyen et al. ............. 355/18 |
| 6,271,146 B1 * | 8/2001 | Ross .......................... 438/723 |
| 6,489,030 B1 * | 12/2002 | Wu et al. ................... 428/447 |

FOREIGN PATENT DOCUMENTS

WO  WO 98 43294  10/1988

OTHER PUBLICATIONS

J.C.M. Hui, et al.,: "Integration of low k spin–on polymer (SOP) using electron beam cure for non–etch–back application" Proceedings of the IEEE 1998 International Interconnect Technology Conference, 1998, pp. 217–219, XP000920722, New York.

Patent Abstracts of Japan, vol. 1999, No. 12, Oct. 29, 1999—& JP 11 186526 A (Samsung Electron Co., Ltd.) Jul. 9, 1999.

* cited by examiner

*Primary Examiner*—David Nelms
*Assistant Examiner*—Renee' R. Berry
(74) *Attorney, Agent, or Firm*—Roberts & Mercanti LLP

(57) ABSTRACT

A process for the formation of structures in microelectronic devices such as integrated circuit devices. Vias, interconnect metallization and wiring lines are formed using single and dual damascene techniques wherein dielectric layers are treated with a wide electron beam exposure.

38 Claims, 8 Drawing Sheets

ELECTRON BEAM PROCESS DURING DAMASCENE PROCESSING

CROSS-REFERENCE TO RELATED APPLICATION

This application is a division of U.S. patent application Ser. No. 09/270,536, filed Mar. 17, 1999.

BACKGROUND OF THE INVENTION

1. Field of the Invention

The present invention relates to the formation of structures in microelectronic devices such as integrated circuit devices. More particularly, the invention relates to the formation of vias, interconnect metallization and wiring lines using single and dual damascene processes.

2. Description of the Related Art

In the production of microelectronic devices, integrated circuits utilize multilevel wiring structures for interconnecting regions within devices and for interconnecting one or more devices within the integrated circuits. In forming such structures, it is conventional to provide first lower level wiring lines and then to form a second level wiring line in contact with the first level wiring lines. One or more interconnections are typically formed between the first and second level wiring lines or to other portions of the integrated circuit device.

One conventional method for forming a two level wiring structure is to first form a two level interconnect structure over a substrate. The surface of a substrate may be the surface of a silicon device structure or the surface of substrate may be an insulating layer. An oxide layer is typically deposited over the substrate by chemical vapor deposition. The first level interconnect structures are defined by a conventional photolithography process which forms openings through the oxide layer where the first level interconnects will be formed. Generally, the openings expose portions of conductors in the substrate to which interconnects are formed. The openings are filled with a metal interconnect such as titanium nitride or tungsten to form the interconnect and form a metal plug. The interconnect may be formed by CVD followed by an etchback or polishing process. Then a layer of metal such as aluminum is deposited over the surface of the oxide layer and over the metal plug to a thickness appropriate for second level wiring lines. The metal layer is then patterned into the second level wiring lines. The second level wiring lines are defined in a conventional photolithography process by providing a layer of photoresist over the metal layer, exposing the photoresist through a mask and removing portions of the exposed photoresist layer to form a photoresist etch mask. The portions of the metal layer exposed by openings in the photoresist mask are then removed by etching and the photoresist mask is removed by ashing. After the two level interconnect structure is formed, it is necessary to provide an intermetal dielectric (IMD) layer between the second level wiring lines and covering the second level wiring lines to accommodate further processing of the integrated circuit device. The intermetal dielectric layer might consist of one or more layers of oxide deposited by plasma enhanced chemical vapor deposition or other processes. The intermetal dielectric layer formed in this manner generally has an uneven surface topography. It is thus necessary to planarize the intermetal dielectric layer, using for example chemical mechanical polishing (CMP), to form a planarized intermetal dielectric layer.

The foregoing method of forming a the two level interconnect structure of has a variety of disadvantages. For those applications which use copper within the conductors or wiring lines, etching of the copper metal is very difficult since appropriate etching chemicals and techniques have not yet been identified. It is therefore desirable to utilize a method of forming wiring lines that does not rely on patterning a metal layer in a chemical etching process. Reduced device dimensions also introduce difficulties into the line formation method. Depositing metals into openings in dielectric layers and depositing dielectric materials into relatively narrow openings between metal lines are difficult processes that are subject to void formation and the trapping of impurities. This is particularly true as interconnects and wiring lines are made smaller and the spacing between wiring lines is made narrower. As such, the described prior process exhibits a high rate of defect formation which increases for smaller design rules. In addition, providing the necessary planar surface on the intermetal dielectric layer after completion of the two level interconnect structure requires additional processing steps. It is desirable whenever possible to reduce the number of processing steps required to form a device because reducing the number of processing steps shortens the time required to produce the device and because eliminating processing steps improves yields and so reduces costs.

One alternative to the conventional interconnect formation process is the so called dual damascene process. Dual damascene processes are scaleable to smaller design rules and produce a planarized surface over the interconnect structure. Accordingly, a surface that is appropriate for further processing steps can be obtained using the dual damascene process in fewer process steps than discussed above. The dual damascene process begins with deposition of an oxide layer over a substrate. A relatively thin silicon nitride etch stop layer is deposited over the oxide layer for use in a subsequent etching step. A layer of intermetal dielectric is then deposited on the etch stop layer. Typically, the intermetal dielectric material is silicon oxide so that the underlying silicon nitride layer is an effective etch stop when openings for second level interconnects are provided in the oxide intermetal oxide layer. The thickness of the intermetal oxide layer is chosen to be that appropriate for the second level metal wiring lines.

A series of photolithography steps are performed to first define a pattern of the second level wiring lines and then to define the pattern of the interconnects within the first level of the interconnect structure. A mask is formed on the intermetal oxide layer where the mask includes a pattern of openings that correspond to the pattern of wiring lines desired for the second level wiring lines. Openings are then formed in the intermetal oxide layer by etching through the openings in the photoresist mask. The etching step proceeds first through the intermetal oxide layer to leave remaining portions of the intermetal oxide layer between the openings. This first etching steps stops on the silicon nitride layer, and then etching is performed aligned with the openings to etch through the silicon nitride layer, leaving remaining portions of the silicon nitride layer on either side of the openings. The photoresist mask is then removed by ashing. It is generally necessary for the width of the openings in the patterned intermetal oxide layer to be greater than the lithography resolution limit because further photolithography steps are necessary to define the interconnects of the first level. Forming the openings wider than the resolution limit provides greater process latitude for the steps used to form the first level interconnects.

A photoresist mask is formed over the device by conventional photolithography. Openings are provided in the mask that expose selected portions of the first oxide layer lying within the openings. Etching is performed on the first oxide layer exposed within the openings in the photoresist mask to define the pattern of interconnects that make up the first level of the interconnect structure. The photoresist mask is then removed by ashing. Next, a layer of metal is deposited over the device to fill the openings in the intermetal oxide layer and to fill the openings in the first oxide layer. Conventionally one overfills the openings in the intermetal oxide layer to ensure that the openings in both the intermetal oxide and the first oxide layer are completely filled. The excess metal is then removed, typically in a CMP process, to provide the second level metal wiring lines and first level interconnects of the two level interconnect structure. The final CMP step provides a planarized surface which is well suited to further processing steps. The dual damascene process provides several advantages over the conventional process, however, it is very demanding from a process technology point of view. In particular, the need for a tantalum nitride, tungsten nitride or titanium nitride diffusion barrier layer adds considerable unwanted thickness to the structure. It is therefore desirable to develop a damascene process that has wider process latitude and is more readily adapted to a high volume manufacturing process by either eliminating or reducing the thickness of such diffusion barrier layers. According to the one aspect of the invention, a nitride barrier layer may be eliminated by substituting a cured an upper portion of an applied dielectric layer such that is serves the purpose of the nitride layer. In another aspect of the invention, two dielectric layers are applied in juxtaposition to one another and the upper layer cured by electron beam exposure. The compositions of such dielectric layers are more compatible with one another, have reduced interlayer diffusion and hence can be thinner than nitride layers. Integrated circuits fabricated from thinner layers allow more features per device.

SUMMARY OF THE INVENTION

The invention provides a process for producing a microelectronic device which comprises:

(a) applying a dielectric layer onto a substrate;

(b) exposing the dielectric layer to electron beam irradiation under conditions sufficient to cure an upper portion of the dielectric layer and render the upper portion a polish stop layer while not substantially curing a lower portion of the dielectric layer;

(c) imagewise patterning the dielectric layer to form vias in the dielectric layer extending to the substrate;

(d) depositing a metal into the vias and onto a top surface of the dielectric layer;

(e) removing the metal from the top surface of the dielectric layer.

The invention also provides a process for producing a microelectronic device which comprises:

(a) applying a first dielectric layer onto a substrate;

(b) applying a second dielectric layer onto the first dielectric layer;

(c) exposing the second dielectric layer to electron beam irradiation under conditions sufficient to cure the second dielectric layer and render the second dielectric layer a polish stop layer while not substantially curing the first dielectric layer;

(d) imagewise patterning the first and second dielectric layers to form vias in the first and second dielectric layers extending to the substrate;

(e) depositing a metal into the vias and onto a top surface of the second dielectric layer;

(f) removing the metal from the top surface of the second dielectric layer.

The invention further provides a process for producing a microelectronic device which comprises:

(a) applying a first dielectric layer onto a substrate;

(b) exposing the first dielectric layer to electron beam irradiation under conditions sufficient to cure an upper portion of the first dielectric layer and render the upper portion of the first dielectric layer an etch stop layer while not substantially curing a lower portion of the first dielectric layer;

(c) applying a second dielectric layer onto the first dielectric layer;

(d) exposing an upper portion of the second dielectric layer to electron beam irradiation under conditions sufficient to cure the upper portion of the second dielectric layer and render the upper portion of the second dielectric layer a polish stop layer while not substantially curing a lower portion of the second dielectric layer;

(e) imagewise patterning the second dielectric layer to form trenches in the dielectric layers extending to the first dielectric layer;

(f) imagewise patterning the first dielectric layer to form vias in the first dielectric layer extending to the substrate;

(g) depositing a metal into the vias, trenches and onto a top surface of the second dielectric layer;

(h) removing the metal from the top surface of the second dielectric layer.

The invention still further provides a process for producing a microelectronic device which comprises:

(a) applying a first dielectric layer onto a substrate;

(b) applying a second dielectric layer onto the first dielectric layer;

(c) exposing the second dielectric layer to electron beam irradiation under conditions sufficient to cure the second dielectric layer and render the second dielectric layer an etch stop layer while not substantially curing the first dielectric layer;

(d) applying a third dielectric layer onto the second dielectric layer;

(e) applying a fourth dielectric layer onto the third dielectric layer;

(f) exposing the fourth dielectric layer to electron beam irradiation under conditions sufficient to cure the fourth dielectric layer and render the fourth dielectric layer a polish stop layer while not substantially curing the third dielectric layer;

(g) imagewise patterning the third and fourth dielectric layers to form trenches in the third and fourth dielectric layers extending to the second dielectric layer;

(h) imagewise patterning the first and second dielectric layers to form vias in the first and second dielectric layers extending to the substrate;

(i) depositing a metal into the vias, trenches and onto a top surface of the fourth dielectric layer;

(j) removing the metal from the top surface of the fourth dielectric layer.

The invention also provides a process for producing a microelectronic device which comprises:

(a) applying a first dielectric layer onto a substrate;

(b) exposing the first dielectric layer to electron beam irradiation under conditions sufficient to cure an upper portion of the first dielectric layer and render the upper portion of the first dielectric layer an etch stop layer while not substantially curing a lower portion of the first dielectric layer;

(c) imagewise patterning the irradiated portion of the first dielectric layer to form vias extending to the lower portion of the first dielectric layer;

(d) applying a second dielectric layer onto the first dielectric layer;

(e) exposing an upper portion of the second dielectric layer to electron beam irradiation under conditions sufficient to cure the upper portion of the second dielectric layer and render the upper portion of the second dielectric layer a polish stop layer while not substantially curing a lower portion of the second dielectric layer;

(f) imagewise patterning the second dielectric layer to form trenches in the second dielectric layers and vias in the first dielectric layer extending to the substrate;

(g) depositing a metal into the vias, trenches and onto a top surface of the second dielectric layer;

(h) removing the metal from the top surface of the second dielectric layer.

The invention surther provides a process for producing a microelectronic device which comprises:

(a) applying a first dielectric layer onto a substrate;

(b) applying a second dielectric layer onto the first dielectric layer;

(c) exposing the second dielectric layer to electron beam irradiation under conditions sufficient to cure the second dielectric layer and render the second dielectric layer an etch stop layer while not substantially curing the first dielectric layer;

(d) imagewise patterning the second dielectric layer to form vias extending to the first dielectric layer;

(e) applying a third dielectric layer onto the second dielectric layer;

(f) applying a fourth dielectric layer onto the third dielectric layer;

(g) exposing the fourth dielectric layer to electron beam irradiation under conditions sufficient to cure the fourth dielectric layer and render the fourth dielectric layer a polish stop layer while not substantially curing the third dielectric layer;

(h) imagewise patterning the third and fourth dielectric layers to form trenches in the third and fourth dielectric layers and vias in the first and second dielectric layer extending to the substrate;

(i) depositing a metal into the vias, trenches and onto a top surface of the fourth dielectric layer;

(j) removing the metal from the top surface of the fourth dielectric layer.

DETAILED DESCRIPTION OF THE PREFERRED EMBODIMENT

Figure 1:
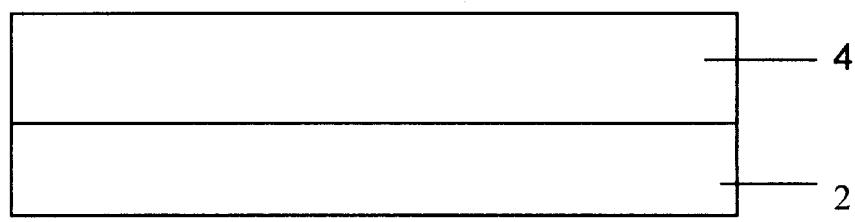
FIG. 1 shows a schematic representation of a substrate coated with a dielectric.

According to a first embodiment of the invention, a dielectric coating 4 is formed on a substrate 2 as shown in FIG. 1. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof.

Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The dielectric composition may comprise any of a wide variety of dielectric forming materials which are well known in the art for use in the formation of microelectronic devices. The dielectric layer may nonexclusiveiy include silicon containing spin-on glasses, i.e. silicon containing polymer such as an alkoxysilane polymer, a silsesquioxane polymer, a siloxane polymer; a poly(arylene ether), a fluorinated poly(arylene ether), other polymeric dielectric materials, nanoporous silica or mixtures thereof.

One useful polymeric dielectric materials useful for the invention include an nanoporous silica alkoxysilane polymer formed from an alkoxysilane monomer which has the formula:

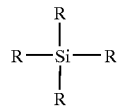

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly (arylene ethers) and mixtures thereof are preferred. Suitable poly(arylene ethers) or fluorinated poly(arylene ethers) are known in the art from U.S. Pat. Nos. 5,155,175, 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Such poly(arylene ethers) have the structure:

wherein $Y_1$ is a first divalent arylene radical and $Y_2$ is a second divalent arylene radical, each divalent arylene radical selected from a first group consisting of:

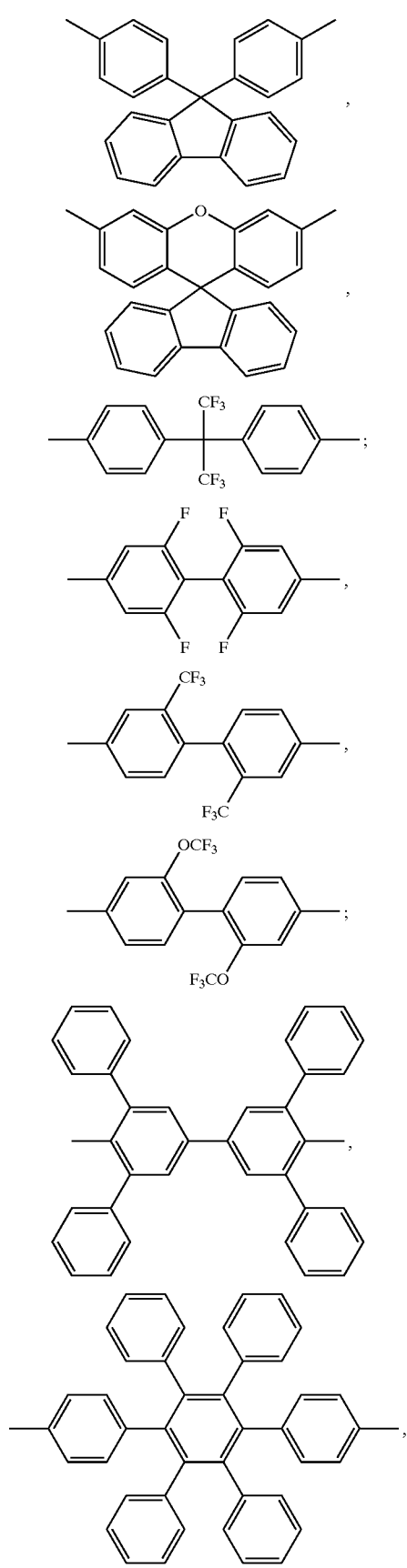
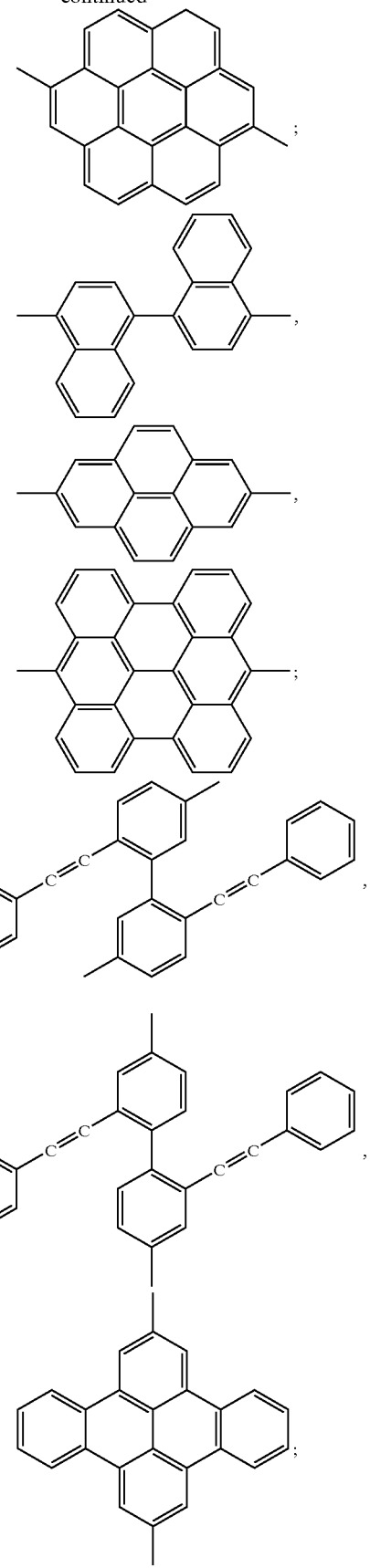

and mixtures thereof, wherein when $Y_1$ and $Y_2$ are both selected to be:

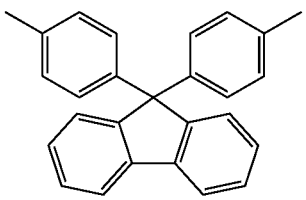

then n=0.1 to 0.9 and m=1−n, else n=0 to 1 and m=1−n; $Ar_1$ is a third divalent arylene radical selected form the second group consisting of:

and $Ar_2$ is a fourth divalent arylene radical selected from the third group consisting of:

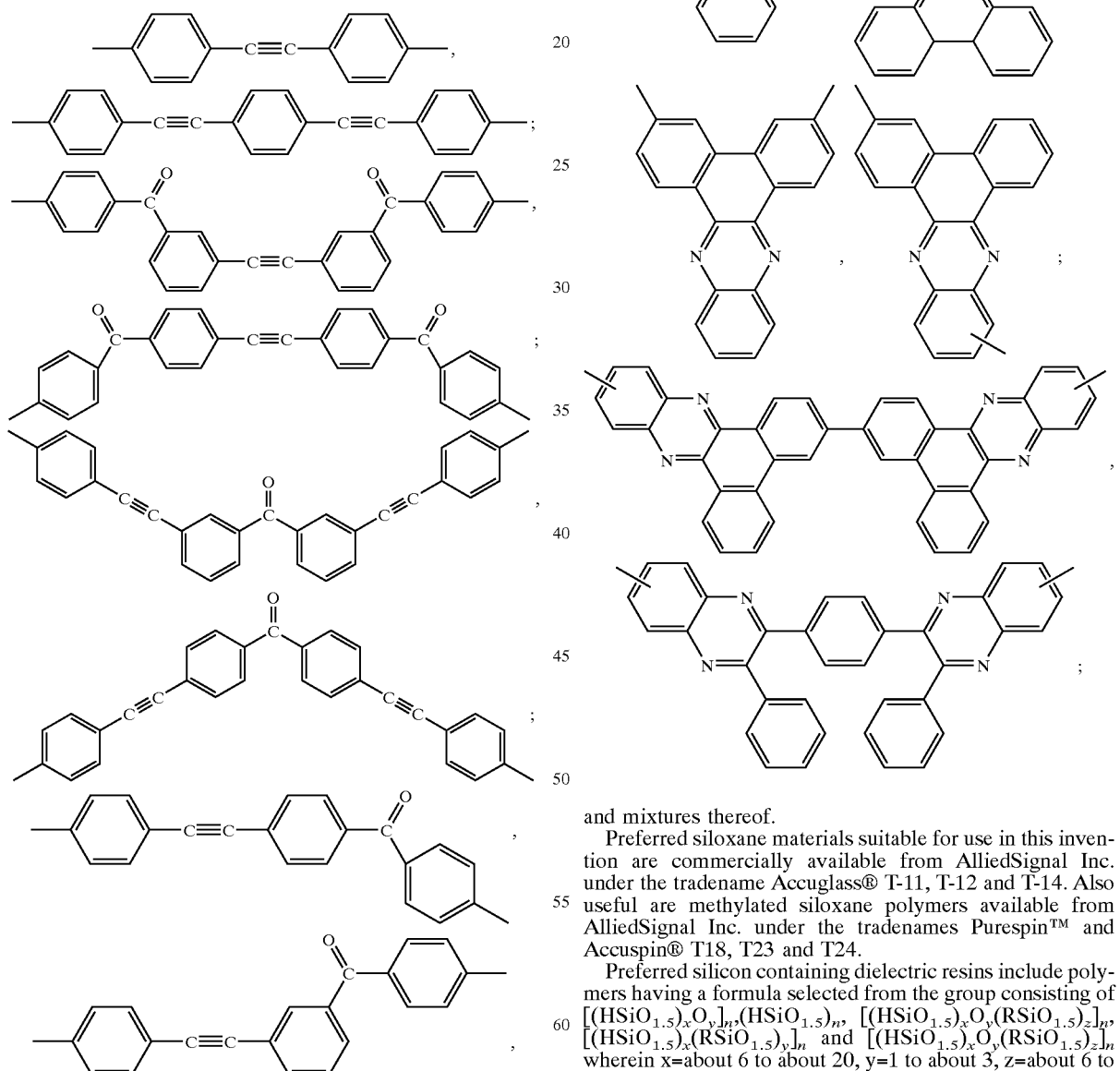

and mixtures thereof.

Preferred siloxane materials suitable for use in this invention are commercially available from AlliedSignal Inc. under the tradename Accuglass® T-11, T-12 and T-14. Also useful are methylated siloxane polymers available from AlliedSignal Inc. under the tradenames Purespin™ and Accuspin® T18, T23 and T24.

Preferred silicon containing dielectric resins include polymers having a formula selected from the group consisting of $[(HSiO_{1.5})_xO_y]_n, (HSiO_{1.5})_n, [(HSiO_{1.5})_xO_y(RSiO_{1.5})_z]_n, [(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

$[H\text{-}SiO_{1.5}]_n[R\text{—}SiO_{1.5}]_m$, $[H_{0.5}\text{—}SiO_{1.5\text{-}1.8}]_n[R_{0.5\text{-}1.0}\text{—}SiO_{1.5\text{-}1.8}]_m$, $[H_{0\text{-}1.0}\text{—}SiO_{1.5}]_n[R\text{—}SiO_{1.5}]_m$, $[H\text{—}SiO_{1.5}]_x[R\text{—}SiO_{1.5}]_y[SiO_2]_z$, wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain low organic content silicon containing polymers such as those having the formula II:

$[HSiO_{1.5}]_n[RSiO_{1.5}]_m$, $[H_{0.5\text{-}1.0}SiO_{1.5\text{-}1.8}]_n[R_{0.5\text{-}1.0}SiO_{1.5\text{-}1.8}]_m$, $[H_{0\text{-}1.0}SiO_{1.5\text{-}2.0}]_n[RSiO_{1.5}]_m$, wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z$;

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm$^3$ to about 3 g/cm$^3$.

The dielectric layer may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The polymer layer may also optionally be exposed to actinic light, such as UV light, to increase its molecular weight. The amount of exposure may range from about 100 mJ/cm$^2$ to about 300 mJ/cm$^2$.

Figure 2:
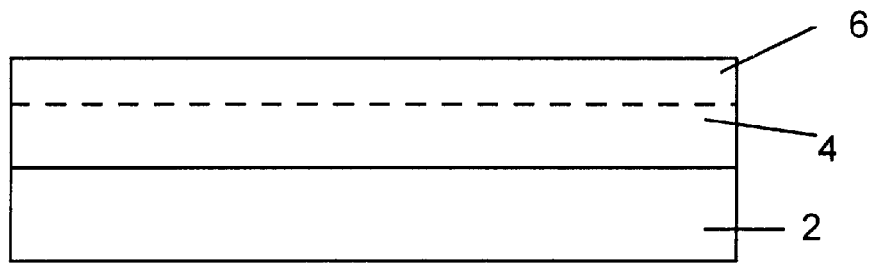
FIG. 2 represents the coated substrate after exposing the top portion of the dielectric to electron beam radiation.

The dielectric layer 4 is then overall exposed to electron beam radiation to provide a region 6 of electron beam exposure of dielectric layer 4 as shown in FIG. 2. The electron beam radiation 8 is concentrated at a plane between the upper and lower surfaces of the dielectric layer 4 to form a hardened or cured zone 6. Preferably, dielectric layer 4 is exposed at about the midpoint of its thickness. Electron beam exposure may be controlled by setting the beam acceleration. The electron beam radiation is controlled such that the electrons reach are concentrated at a plane between the upper and lower surfaces of the dielectric layer 4.

Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of AlliedSignal Inc., under the trade name "Electron-Cure™". The principles of operation and performance characteristics of such device are described in U.S. Pat. No. 5,001,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 μC/cm$^2$ and more preferably from about 50 to about 20,000 μC/cm$^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Figure 3:
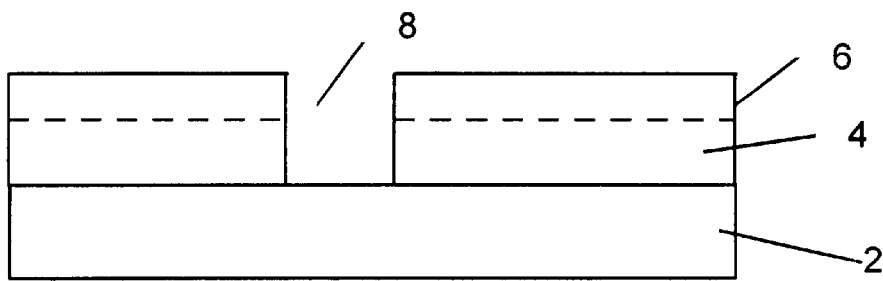
FIG. 3 represents the coated substrate after imagewise patterning and formation of via cavities.

Microvias are formed in the dielectric layer by well known photolithographic techniques using a photoresist composition. FIG. 3 shows the coated substrate after imagewise patterning and removal of portions of the dielectric to form via cavities 8 through the electron beam exposed and nonexposed portions of the dielectric layer. Such are formed in a manner well known in the art such as by coating the top of layer 6 with a photoresist, imagewise exposing to actinic radiation such as through a suitable mask, developing the photoresist and etching away portions of layers 4 and 6 to form vias 8. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the dielectric surface and the inside walls of the vias by plasma etching. Plasma generators which are capable of are described in U.S. Pat. Nos. 5,174,856 and 5,200,031.

Figure 4:
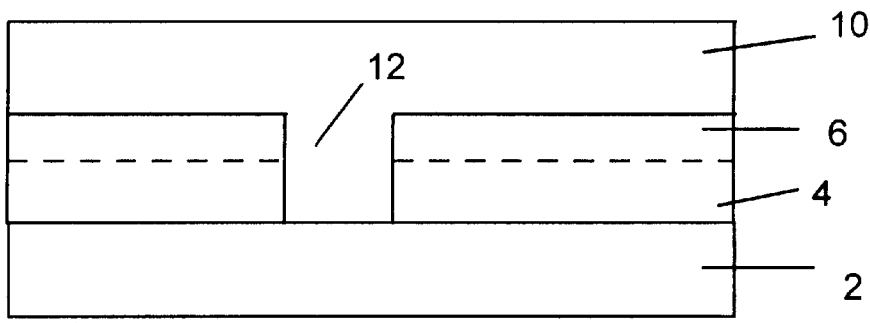
FIG. 4 represents the coated substrate after filling the via and covering the top of the dielectric with a metal conductor.
Figure 5:
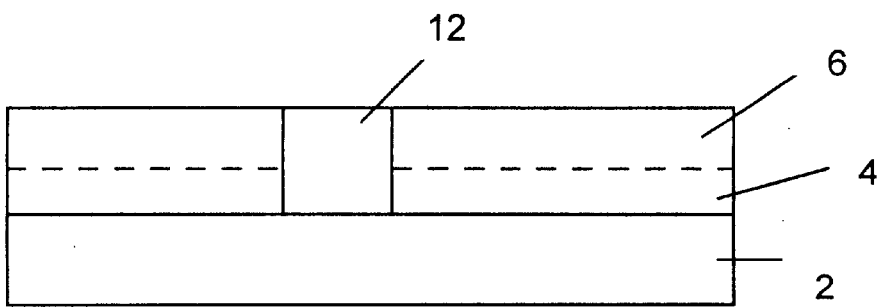
FIG. 5 represents a produced microelectronic device after removing the metal from the top surface of the dielectric layer.

Next the vias are filled with a conductive metal which fills the vias in area 12 and also forms a layer top 10 on top of the hardened dielectric 6 as shown in FIG. 4. Suitable metals include aluminum, aluminum alloys, copper, copper alloys, tantalum, tungsten, titanium or other metal typically employed in the formation of microelectronic devices. The metal may be applied by such techniques as vapor deposition, sputtering, evaporation and the like. The thickness of the metal layers is preferably from about 3000 to 5000 Angstroms. Typically the metal is applied by first forming a barrier metal seeding layer on the walls of the vias and the top dielectric. Then the balance of the metal is applied. The barrier metal serves to prevent diffusion of the conductive metal into the dielectric layers. Barrier metal may be, for example, a nitride such Ti, TaN or TiN. Next the layer 10 is removed such as by chemical mechanical polishing or an etch back by techniques which are well known in the art. The hardened dielectric layer 6 acts as a polish stop and the resulting microelectronic device is represented by FIG. 5. FIGS. 1–5 show the process of forming a portion of a microelectronic device. It is to be understood that these steps may be repeated to provide a series of suitable layers and conductive paths over one another on the substrate.

Figure 6:
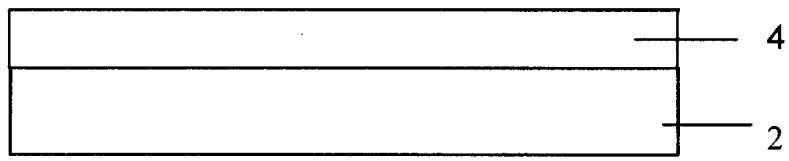
FIG. 6 shows a schematic representation of a substrate coated with a first dielectric.
Figure 7:
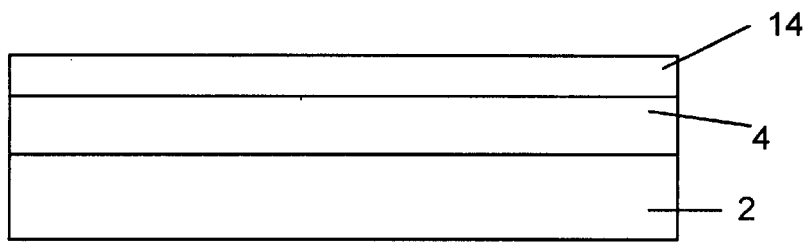
FIG. 7 shows a schematic representation of a substrate coated with a first and a second dielectric.
Figure 8:
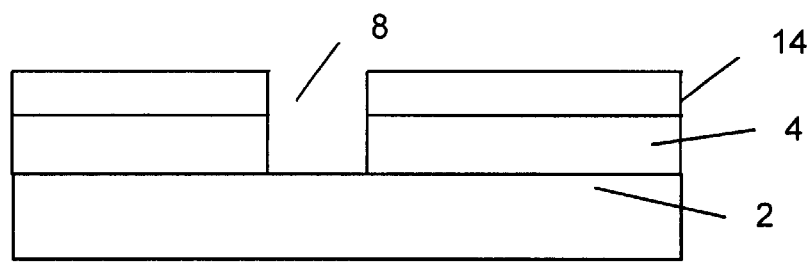
FIG. 8 represents the coated substrate after imagewise patterning and removal of via cavities in the first and second dielectric layers.
Figure 9:
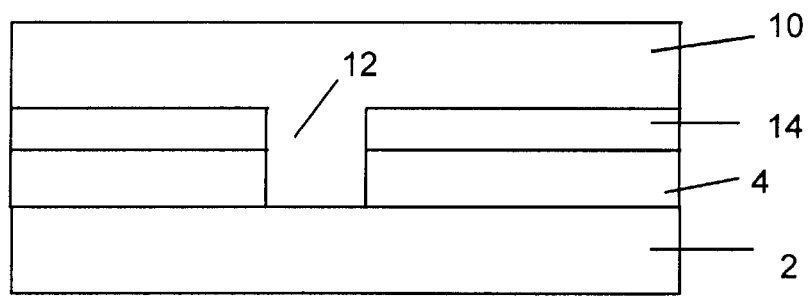
FIG. 9 represents the coated substrate after filling the via and covering the top of the second dielectric with a metal conductor.
Figure 10:
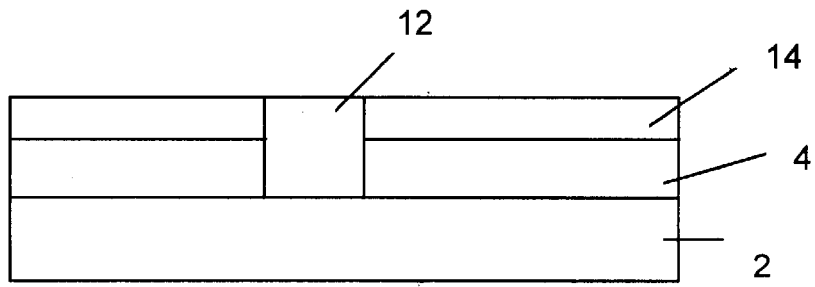
FIG. 10 represents a produced microelectronic device after removing the metal from the top surface of the second dielectric layer.

FIGS. 6 though 10 show another embodiment of the invention wherein two separate dielectric layers are used in a fashion similar to that described for FIGS. 1 thorough 5. In this embodiment, FIG. 6 shows a schematic representation of a substrate 2 coated with a first dielectric layer 4 which is applied as above to substrate 2. FIG. 7 shows a schematic representation of a second dielectric layer 14 applied on the first dielectric layer 4. The second dielectric layer may comprise any of the materials mentioned above as suitable for use as the first dielectric layer. It is preferred, although not necessary that the second dielectric material be different from that of the first dielectric material. This assists in controlling and differentiating the properties of the first and second dielectric layers. The second dielectric layer is then exposed to electron beam radiation as above. In this case, only the second dielectric layer 14 is exposed to electron beam radiation which the first dielectric layer 4 is not substantially exposed to electron beam radiation. FIG. 8 represents the coated substrate after imagewise patterning and removal of via cavities in the first and second dielectric layers. Vias 8 are formed through photolithography and etching as above. Likewise, the metal layer 10 and vias 12 are formed in the same fashion as described above. FIG. 9 shows the coated substrate after filling the via and covering the top of the second dielectric with a metal conductor. FIG. 10 shows a produced microelectronic device after removing the metal from the top surface of the second dielectric layer.

Figure 11:
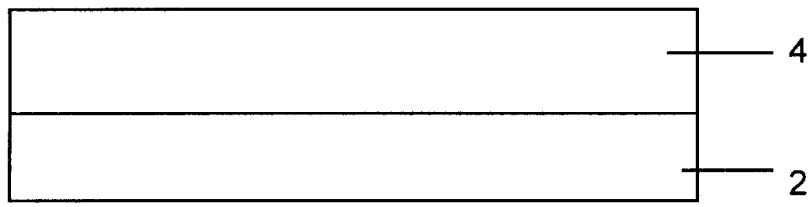
FIG. 11 shows a schematic representation of a substrate coated with a first dielectric.
Figure 12:
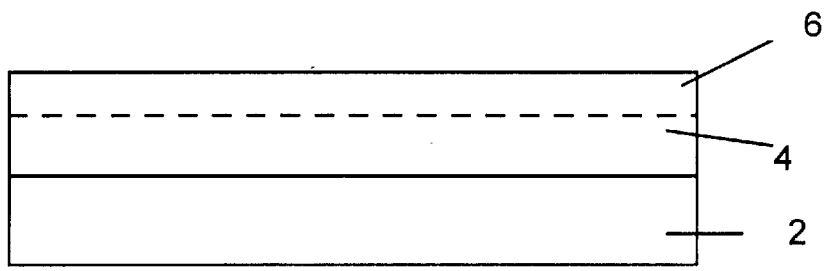
FIG. 12 shows a schematic representation of a substrate coated with a first dielectric which has been exposed to electron beam radiation.
Figure 13:
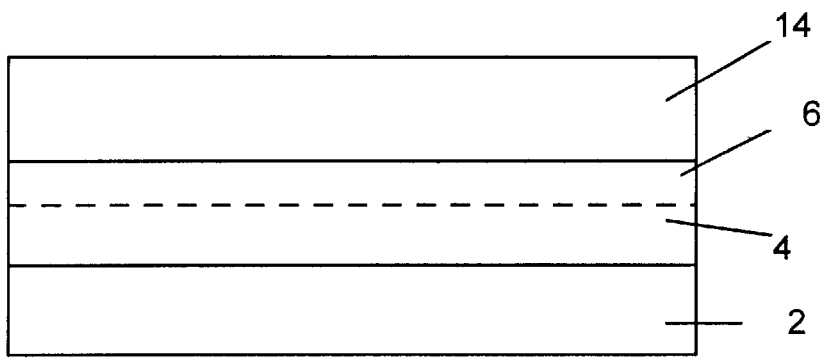
FIG. 13 shows a schematic representation of a substrate coated with a first dielectric which has been exposed to electron beam radiation which has then been coated with a second dielectric.
Figure 14:
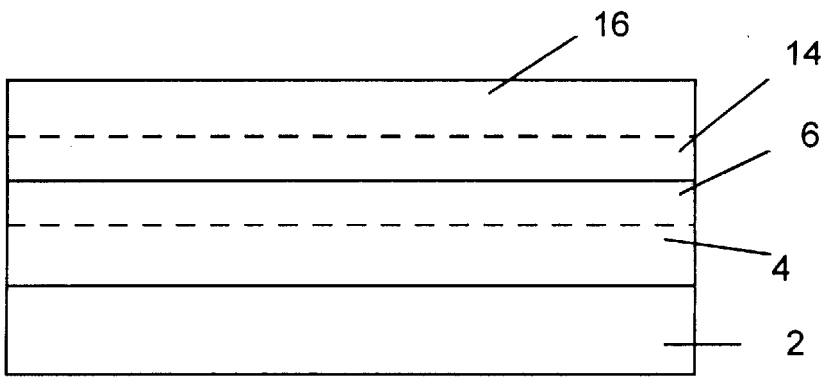
FIG. 14 representations a substrate coated with first and second dielectrics which have been exposed to electron beam radiation.
Figure 15:
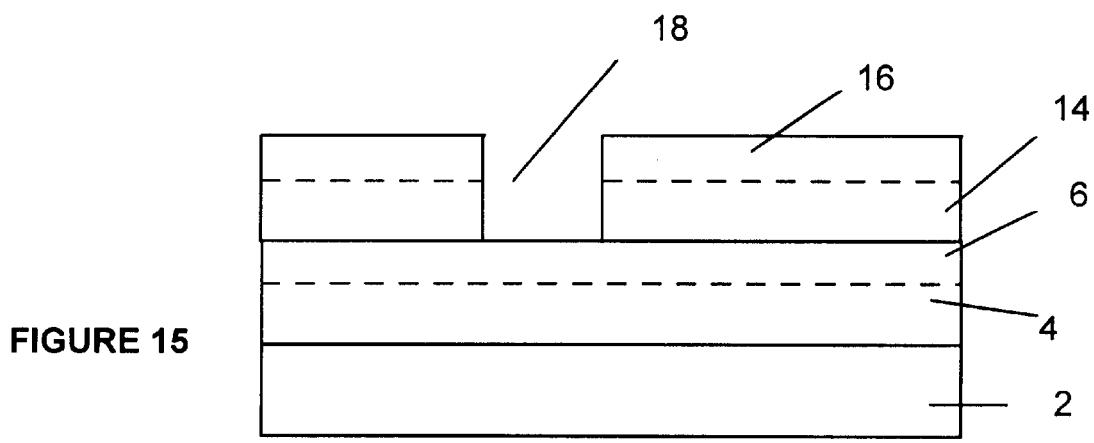
FIG. 15 shows the coated substrate after imagewise patterning and removal of trenches in the second dielectric layer.
Figure 17:
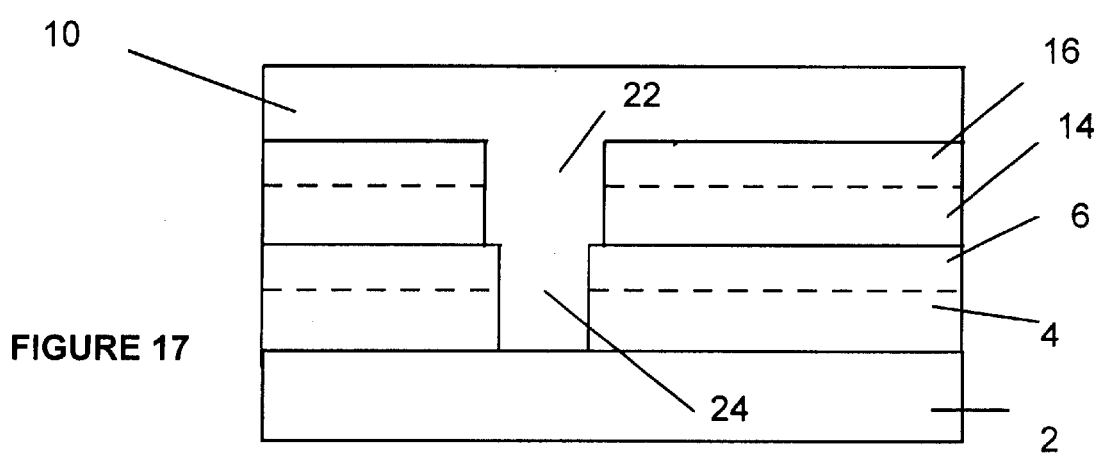
FIG. 17 shows the coated substrate after filling the vias and trenches and covering the top of the second dielectric with a metal conductor.
Figure 18:
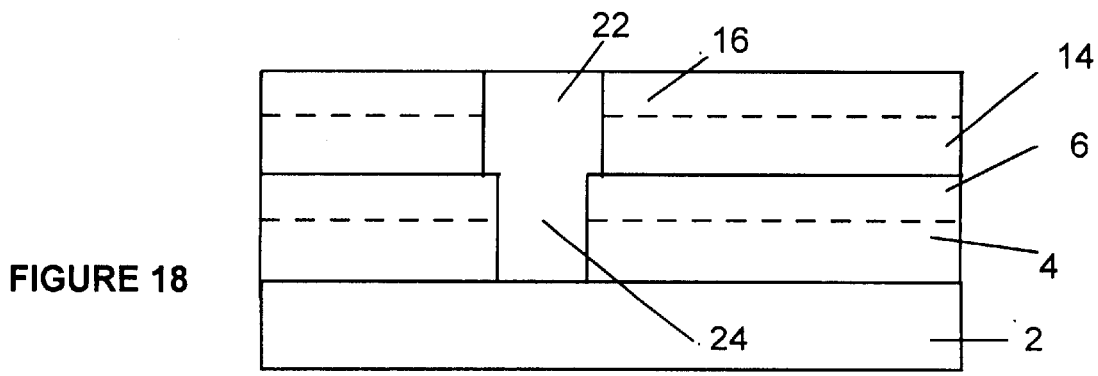
FIG. 18 represents a produced microelectronic device after removing the metal from the top surface of the second dielectric layer.

The first and second embodiments of the invention as exemplified in FIGS. 1–5 and FIGS. 6–10 show a single damascene process sequence. The invention is also useful in a dual damascene process as will now be described. According to a third embodiment of the invention, a dielectric coating 4 is formed on a substrate 2 as shown in FIG. 11. The dielectric layer 4 is then overall exposed to electron beam radiation to provide a region 6 of electron beam exposure of dielectric layer 4 as shown in FIG. 12. Electron beam exposure may be controlled by setting the beam acceleration. The top of the exposed dielectric layer 6 is then coated with another layer of a dielectric 14 as shown in FIG. 13. The second dielectric layer may be any of the previously described dielectric materials, however, preferably it is different from the first dielectric material. The second dielectric layer is similarly exposed to electron beam radiation to form the exposed region 16 as shown in FIG. 14. Trenches 18 are then formed in the exposed and nonexposed portions 16 and 14 of the second dielectric layer by well known photolithographic techniques using a photoresist composition as described above for the formation of vias. Layer 6 acts as an etch stop. FIG. 15 shows the substrate after imagewise patterning and removal of trenches in the second dielectric layer. The exposed and nonexposed portions of the underlying first dielectric layer are then provided with vias 20 by repeating the processing sequence of applying a photoresist layer portion 16 imagewise exposing through a mask having apertures centered on trenches 18 but having a narrower diameter. After developing the photoresist and etching away portions of layers 4 and 6 vias 20 are formed. Next the vias 20 and trenches 18 are filled with a conductive metal in areas 24 and 22 and also forms a layer top 10 on top of the hardened dielectric 16 as shown in FIG. 17. Next the layer 10 is removed such as by chemical mechanical polishing or an etch back by techniques. The hardened dielectric layer 16 acts as a polish stop and the resulting microelectronic device is represented by FIG. 18.

Figure 19:
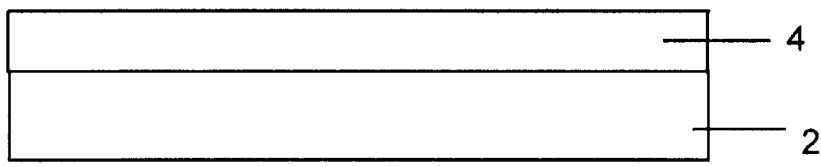
FIG. 19 shows a schematic representation of a substrate coated with a first dielectric.
Figure 20:
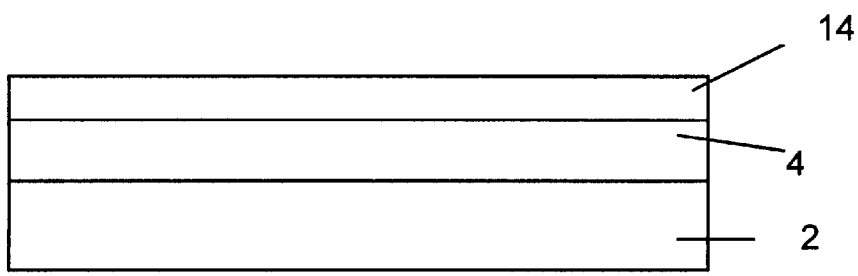
FIG. 20 shows a schematic representation of a substrate coated with first and second dielectric layers wherein the second dielectric has been exposed to electron beam radiation.
Figure 21:
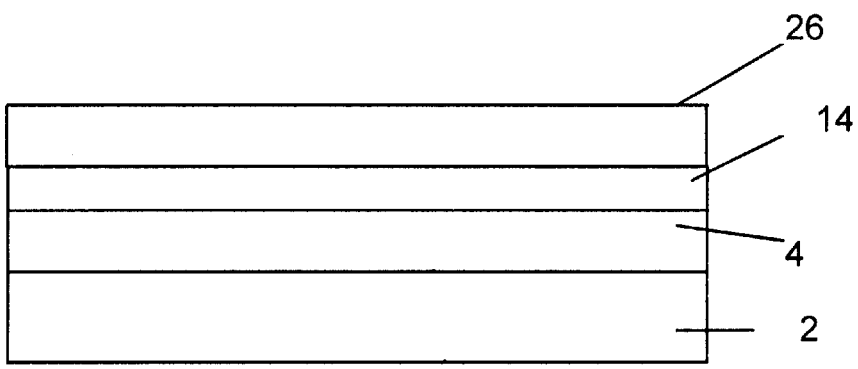
FIG. 21 shows the coated substrate of FIG. 20 wherein a third dielectric has been coated on the second.
Figure 22:
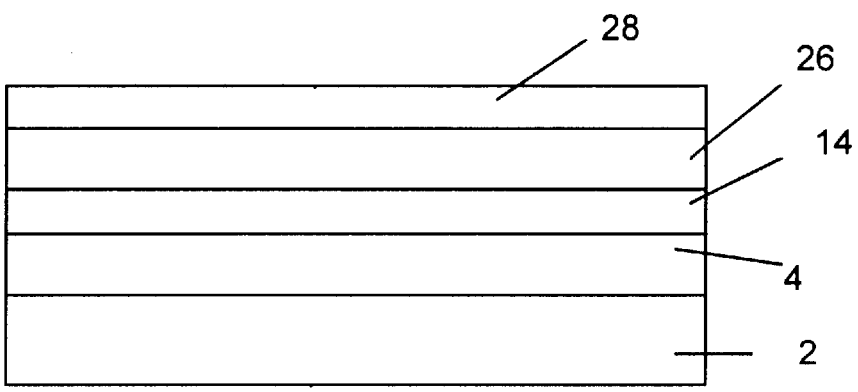
FIG. 22 shows the coated substrate of FIG. 21 wherein a fourth dielectric has been coated on the third and wherein the fourth has been exposed to electron beam radiation.

Another dual damascene process is shown in FIGS. 19 through 26. According to this embodiment of the invention, a first dielectric coating 4 is formed on a substrate 2 as shown in FIG. 19. The first dielectric layer 4 is then coated with a second dielectric layer 14. Layer 14 is then overall exposed to electron beam radiation as shown in FIG. 20. Electron beam exposure may be controlled by setting the beam acceleration. The second dielectric layer 14 is then coated with a third dielectric layer 26 as shown in FIG. 21. The third dielectric layer 26 is then coated with a fourth dielectric layer 28 which is also overall exposed to electron beam radiation as shown in FIG. 22. Each of the first through fourth dielectric layers may be any of the previously described dielectric materials, however, preferably adjacent layers are of different dielectric materials.

Figure 23:
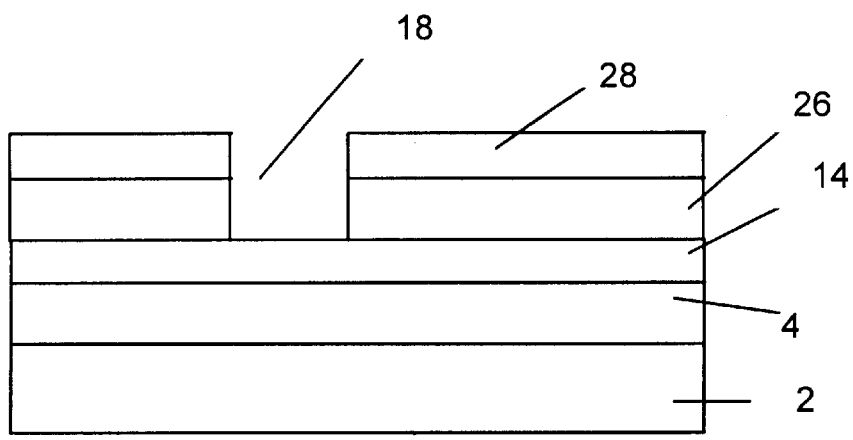
FIG. 23 shows the coated substrate after imagewise patterning and removal of trenches in the third and fourth dielectric layers.
Figure 24:
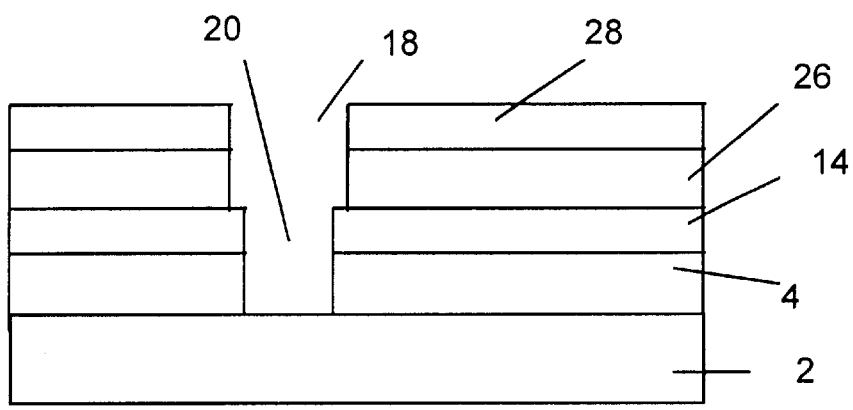
FIG. 24 shows the coated substrate after imagewise patterning and removal of trenches in the third and fourth dielectric layers and vias in the first and second dielectric layers.
Figure 25:
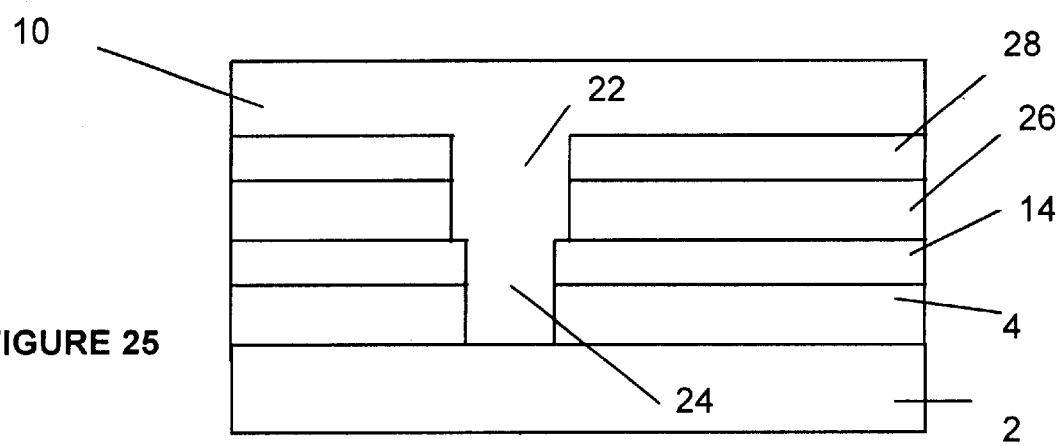
FIG. 25 shows the coated substrate after filling the vias and trenches and covering the top of the fourth dielectric with a metal conductor.
Figure 26:
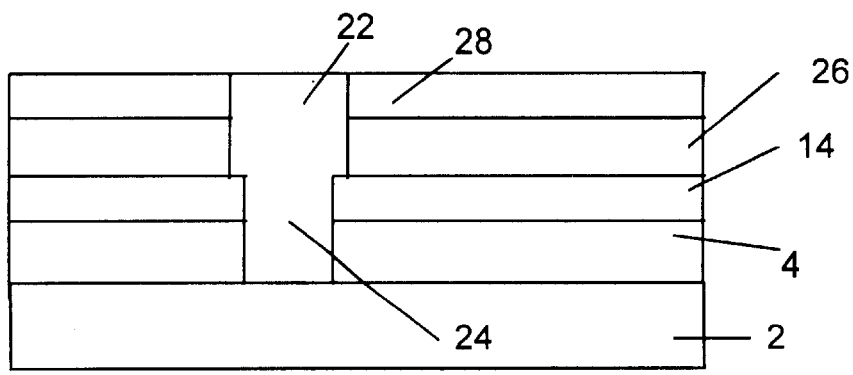
FIG. 26 represents a produced microelectronic device after removing the metal from the top surface of the fourth dielectric layer.

Trenches 18 are then formed in the third and fourth dielectric layers by known photolithographic techniques using a photoresist composition as described above for the formation of vias. Layer 14 acts as an etch stop. FIG. 23 shows the substrate after imagewise patterning and removal of trenches in the third and fourth dielectric layers. The first and second dielectric layers are then provided with vias 20 by repeating the processing sequence of applying a photoresist layer on layer 26, imagewise exposing through a mask having apertures centered on trenches 18 but having a narrower diameter. After developing the photoresist and etching away portions of layers 4 and 14 vias 20 are formed as shown in FIG. 24. Next the vias 20 and trenches 18 are filled with a conductive metal in areas 24 and 22 and also forms a layer top 10 on top of the hardened dielectric 28 as shown in FIG. 25. Next the layer 10 is removed such as by chemical mechanical polishing or an etch back by techniques. The hardened dielectric layer 28 acts as a polish stop and the resulting microelectronic device is represented by FIG. 26.

Figure 16:
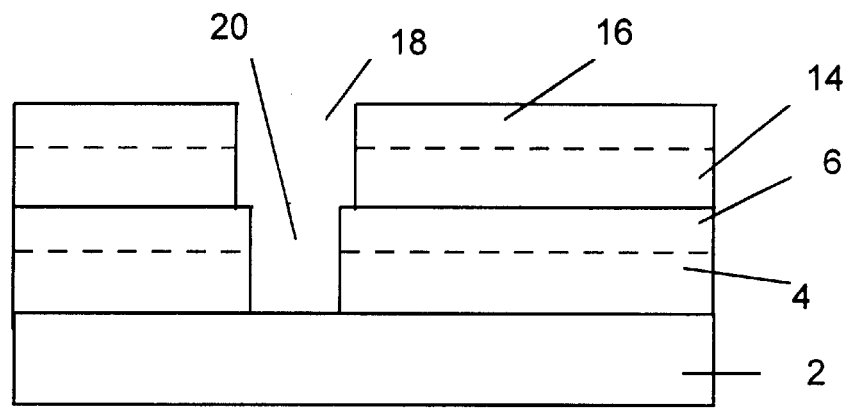
FIG. 16 represents the coated substrate after imagewise patterning and removal of trenches in the second dielectric layer and vias in the first dielectric layer.
Figure 27:
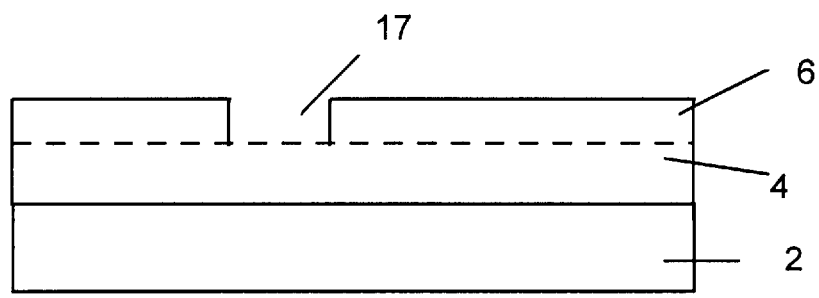
FIG. 27 shows a schematic representation of a substrate coated with a first dielectric which has been exposed to electron beam radiation and then lithographically pattered and etched to provide removed latent via regions.
Figure 28:
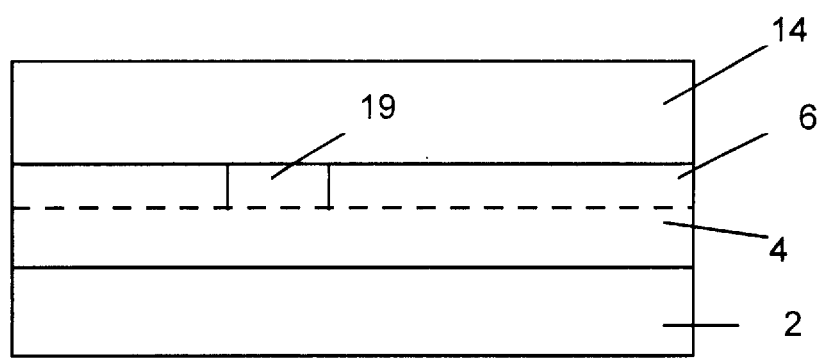
FIG. 28 shows a schematic representation of a substrate coated with a first dielectric which has been exposed to electron beam radiation which has then been coated with a second dielectric and wherein latent via regions have been filled with dielectric.
Figure 29:
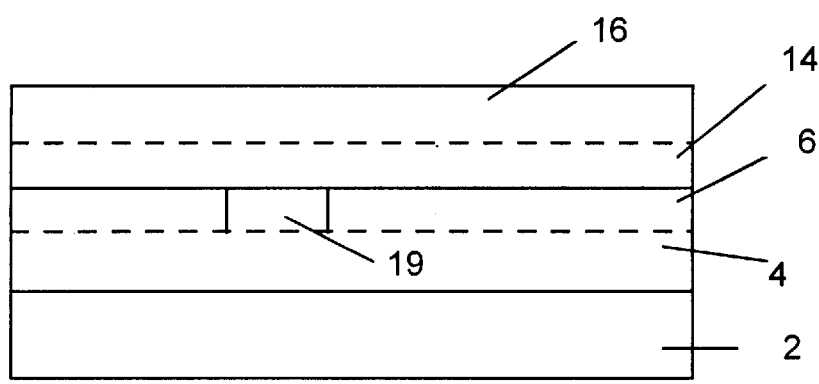
FIG. 29 shows a substrate coated with first and second dielectrics which have been exposed to electron beam radiation and wherein latent via regions have been filled with dielectric.

Another dual damascene embodiment of the invention is shown in FIGS. 27–29. A substrate 2 is first coated with a first dielectric 4 as shown in FIG. 11. The dielectric layer 4 is then overall exposed to electron beam radiation to provide a region 6 of electron beam exposure of dielectric layer 4 which is now an etch stop layer as shown in FIG. 12. The electron beam exposed region 6 is then lithographically pattered and etched to provide removed latent via regions 17 as shown in FIG. 27. The top of the exposed dielectric layer 6 is then coated with another layer of a dielectric 14 as shown in FIG. 28. The second dielectric layer may be any of the previously described dielectric materials, however, preferably it is different from the first dielectric material This provides latent via regions 19 which are filled with the same dielectric material as layer 14. The second dielectric layer is similarly exposed to electron beam radiation to form the exposed region 16 which serves as a polish stop layer as shown in FIG. 29. The second dielectric layer is then coated with a photoresist and pattered with a mask having apertures centered on latent vias 19 but having a wider diameter. After developing the photoresist and etching away portions of layers 16, 14, and 4 as well as filled latent via 19, trenches 18 and vias 20 are formed as shown in FIG. 16. As can be seen, the portion of layer 6 which surrounds latent via 19 acts as an etch stop so that only the dielectric in filled via 19 and the portion of layer 4 underlying filled via 19 are etched away. Next the vias 20 and trenches 18 are filled with a conductive metal in areas 24 and 22 and also forms a layer top 10 on top of the hardened dielectric 16 as shown in FIG. 17. Next the layer 10 is removed such as by chemical mechanical polishing or an etch back by techniques. The hardened dielectric layer 16 acts as a polish stop and the resulting microelectronic device is represented by FIG. 18.

Figure 30:
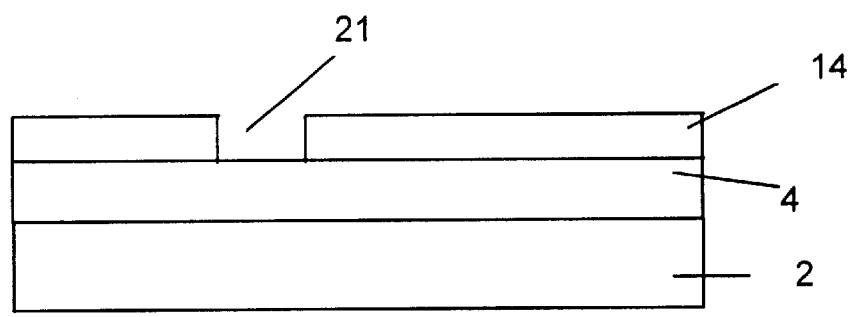
FIG. 30 shows a schematic representation of a substrate coated with first and second dielectric layers wherein the second dielectric has been exposed to electron beam radiation and then the second lithographically pattered and etched to provide removed latent via regions.
Figure 31:
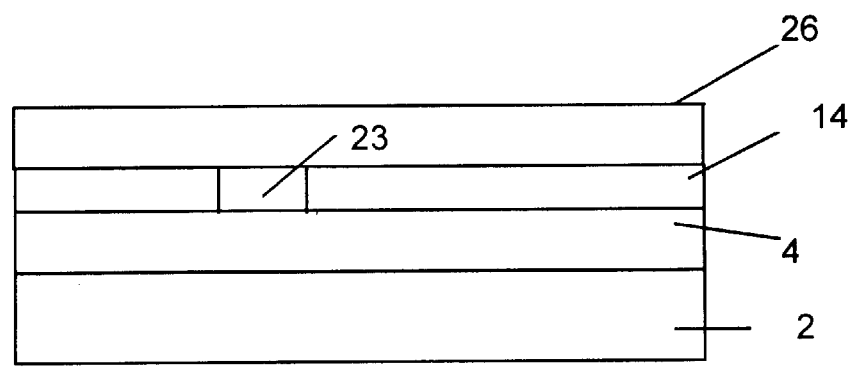
FIG. 31 shows the coated substrate of FIG. 30 wherein a third dielectric has been coated on the second.
Figure 32:
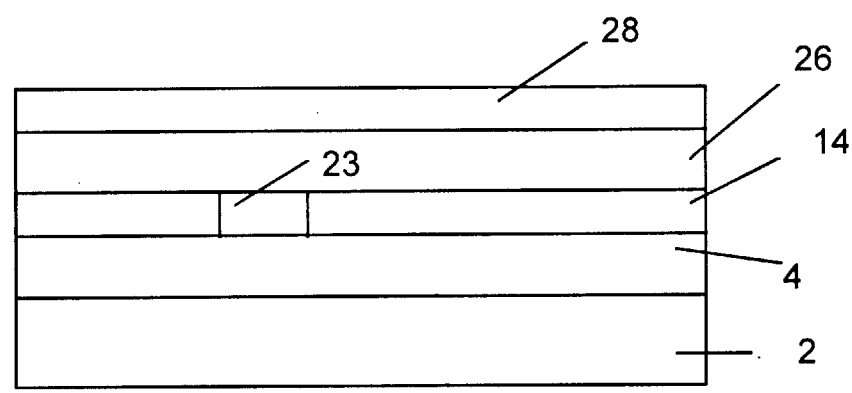
FIG. 32 shows the coated substrate of FIG. 31 wherein a fourth dielectric has been coated on the third and wherein the fourth has been exposed to electron beam radiation.

Another dual damascene embodiment of the invention is shown in FIGS. 30–32. A substrate 2 is first coated with a first dielectric 4 as shown in FIG. 19. The dielectric layer 4 is then coated with a layer of a second dielectric 14 and the second dielectric layer 14 is then overall exposed to electron beam radiation as shown in FIG. 20. The electron beam exposed second dielectric layer 14 is then lithographically pattered and etched to provide removed latent via regions 21 as shown in FIG. 30. The top of the exposed second dielectric layer 6 is then coated with a third layer of a dielectric 26. This provides latent via regions 23 which are filled with the same dielectric material as layer 26 as shown in FIG. 31. A fourth dielectric layer 28 is then coated on the third dielectric layer 26. The fourth dielectric layer is similarly exposed to electron beam radiation to form it into a polish stop layer. The fourth dielectric layer is then coated with a photoresist and pattered with a mask having apertures centered on latent vias 23 but having a wider diameter. After developing the photoresist and etching away portions of layers 28, 26, and 4 as well as filled latent via 23, trenches 18 and vias 20 are formed as shown in FIG. 24. As can be seen, the portion of layer 14 which surrounds latent via 23 acts as an etch stop so that only the dielectric in filled via 23 and the portion of layer 4 underlying filled via 23 are etched away. The second, third and fourth dielectric layers may be any of the previously described dielectric materials, however, alternating layers are preferably of a different from the next layer dielectric material. Next the vias 20 and trenches 18 are filled with a conductive metal in areas 24 and 22 and also forms a layer top 10 on top of the hardened dielectric 28 as shown in FIG. 25. Next the layer 10 is removed such as by chemical mechanical polishing or an etch back by known techniques. The hardened dielectric layer 28 acts as a polish stop and the resulting microelectronic device is represented by FIG. 26.

The following non-limiting examples serve to illustrate the invention.

EXAMPLE 1

A thin film of poly(arylene ether) polymer having a molecular weight of 35,000 is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. Electron beam exposure is conducted in an ElectronCure™ 30 chamber incorporating a large area electron source and quartz lamps for heating the wafer. The cold-cathode gas source produces a large area electron beam (over 200 mm in diameter) having a substantially uniform emission over its entire surface. Electron emission is controlled by the low bias voltage applied to the anode grid. The electron beam penetration depth is about 4000 Å. Electron beam exposure was conducted at a temperature of 200° C. and in an argon atmosphere (10–30 milliTorr). The thin film was spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a via mask. Vias are then formed by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. The via is then formed by sputtering of a Ti/TiN barrier metal and W-CVD via fill. The W is then chemical mechanical polished electron beam exposed layer and the metal patterning process is repeated.

EXAMPLE 2

A thin film of a siloxane polymer commercially available from AlliedSignal Inc. under the tradename Accuglass® T-11 is formed on a 4" silicon wafer using a conventional spin-coating technique. A poly(arylene ether) polymer having a molecular weight of 35,000 is formed on the Accuglass® T-11 layer using a conventional spin-coating technique. After spin-coating, the film is subjected to a hot-plate bake at a temperature of 150° C. for 2 min. The film thickness after the spinning and baking processes is about 4000 Å. Thermal curing is carried out at 425° C. for one hour in a horizontal furnace with $N_2$ flow at atmospheric pressure. The poly(arylene ether) polymer is subjected to an electron beam exposure in an ElectronCure™ 30 chamber incorporating a large area electron source and quartz lamps for heating the wafer. The cold-cathode gas source produces a large area electron beam (over 200 mm in diameter) having a substantially uniform emission over its entire surface. Electron emission is controlled by the low bias voltage applied to the anode grid. The electron beam penetration depth is about 4000 Å or the depth of the poly(arylene ether) polymer. Electron beam exposure was conducted at a temperature of 200° C. and in an argon atmosphere (10–30 milliTorr). The thin film was spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a via mask. Vias are then formed in the two dielectric layers by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. The via is then formed by sputtering of a Ti/TiN barrier metal and W-CVD via fill. The W is then chemical mechanical polished electron beam exposed layer and the metal patterning process is repeated.

EXAMPLE 3

A thin film of a poly(arylene ether) polymer is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. Electron beam exposure is conducted in an ElectronCure™ chamber incorporating a large area electron source and quartz lamps for heating the wafer. The cold-cathode gas source produces a large area electron beam (over 100 mm in diameter) having a substantially uniform emission over its entire surface. Electron emission is controlled by the low bias voltage applied to the anode grid. The electron beam penetration depth is about 4000 Å. Electron beam exposure was conducted at a temperature of 200° C. and in an argon atmosphere (10–30 milliTorr).

A thin film of Accuglass® T-11 siloxane polymer commercially available from AlliedSignal Inc. of Sunnyvale, Calif., having a molecular weight of 35,000 is formed on the poly(arylene ether) layer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. Electron beam exposure of the Accuglass® T-11 polymer is conducted under similar conditions. The electron beam penetration depth is about 4000 Å. The Accuglass® T-11 film is spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a trench mask. Trenches are then formed by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. The electron beam exposed poly(arylene ether) serves as an etch stop. Another layer of the photoresist is spin coated on the Accuglass® T-11 thin film. The photoresist is then imagewise exposed to ultraviolet radiation through a mask which allows exposure through the vias down to the exposed poly(arylene ether) layer. The photoresist is then developed using an aqueous alkaline solution to remove the nonimage portions and define a via mask. Vias are then formed in the exposed poly(arylene ether) layer by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. Vias are then formed in the Accuglass® T-11 thin film and trenches formed in the poly(arylene ether) layer by sputtering of Ti/TiN barrier metal and W-CVD via fill. The W is then chemical mechanical polished back to the electron beam exposed layer and the patterning process is repeated.

EXAMPLE 4

A thin film of a poly(arylene ether) polymer is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. A thin film of a commercially available from AlliedSignal Inc. under the tradename Accuglass® T-11 polymer having a molecular weight of 35,000 is formed on the poly(arylene ether) layer using a conventional spin-coating technique. After spin-coating, the film is subjected to a hot-plate bake at a temperature of 150° C. for 2 min. The film thickness after the spinning and baking processes is in the range of 4000 Å. Thermal curing is carried out at 425° C. for one hour in a horizontal furnace with $N_2$ flow at atmospheric pressure. Electron beam exposure of the Accuglass® T-11 polymer is conducted in an ElectronCure™ 30 chamber incorporating a large area electron source and quartz lamps for heating the wafer. The cold-cathode gas source produces a large area electron beam (over 200 mm in diameter) having a substantially uniform emission over its entire surface. Electron emission is controlled by the low bias voltage applied to the anode grid. The electron beam penetration depth is about 4000 Å. Electron beam exposure was conducted at a temperature of 200° C. and in an argon atmosphere (10–30 milliTorr).

A third thin film of poly(arylene ether) is formed the Accuglass® T-11 polymer layer under similar conditions. A fourth layer of Accuglass® T-11 is formed on the third thin film of poly(arylene ether) polymer. The thin film of a Accuglass® T-11 polymer is similarly exposed to electron beam radiation under similar conditions. The fourth upper Accuglass® T-11 film is spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a trench mask. Trenchs are then formed in the upper Accuglass® T-11 and poly(arylene ether) layers by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. The electron beam exposed lower Accuglass® T-11 thin film serves as an etch stop. Another layer of the photoresist is spin coated on the upper Accuglass® T-11 thin film. The photoresist is then imagewise exposed to ultraviolet radiation through a mask which allows exposure through the vias down to the lower Accuglass® T-11 layer. The photoresist is then developed using an aqueous alkaline solution to remove the nonimage portions and define a trench mask. Trenches are then formed in lower Accuglass® T-11 layer the lower poly(arylene ether) layer by etching. Next the photoresist is completely removed from the dielectric surface and the inside walls of the trenches by plasma etching in a plasma chamber using a typical etching tool. The wafer is then rinsed in a solvent to remove post etch metal residues. A deionized water rinse follows. Vias and trenches formed in the poly(arylene ether) and Accuglass® T-11 layers are then filled with a metal by sputtering of Ti/TiN barrier metal and Cu-CVD via fill. The Cu is then chemical mechanical polished to the upper electron beam exposed Accuglass T-11 layer which acts as a polish stop. The process is then repeated.

While the present invention has been particularly shown and described with reference to preferred embodiments, it will be readily appreciated by those of ordinary skill in the art that various changes and modifications may be made without departing from the spirit and scope of the invention. In particular, while the foregoing examples have employed certain dielectric materials, these are only exemplary and many others could be used as well such as silicon containing polymers including alkoxysilane polymers, silsesquioxane polymers, siloxane polymers; poly(arylene ethers), fluorinated poly(arylene ethers), other polymeric dielectric materials, nanoporous silicas or mixtures thereof. It is intended that the claims be to interpreted to cover the disclosed embodiments, those alternatives which have been discussed above and all equivalents thereto.

What is claimed is:

1. A microelectronic device produced by a process which comprises:
   (a) applying a dielectric layer onto a substrate;
   (b) exposing the dielectric layer to electron beam irradiation under conditions sufficient to cure an upper portion of the dielectric layer and render the upper portion a polish stop layer while not substantially curing a lower portion of the dielectric layer;
   (c) imagewise patterning the dielectric layer to form vias in the dielectric layer extending to the substrate;
   (d) depositing a metal into the vias and onto a top surface of the dielectric layer;
   (e) removing the metal from the top surface of the dielectric layer.

2. The micro-electronic device of claim 1 wherein the removing of metal from the top surface of the dielectric layer is conducted by chemical mechanical polishing or etching back the metal on the top surface until the polish stop layer is reached.

3. The micro-electronic device of claim 1 wherein the dielectric layer comprises a silicon containing polymer an alkoxysilane polymer, a silsesquioxane polymer, a siloxane polymer, a poly(arylene ether), a fluorinated poly(arylene ether), a nanoporous silica or combinations thereof.

4. The micro-electronic device of claim 1 wherein the substrate comprises gallium arsenide (GaAs), germanium, silicon, silicon germanium, lithium niobate and compositions containing silicon and combinations thereof.

5. The micro-electronic device of claim 1 wherein the electron beam exposing step is conducted at an energy level ranging from about 1 to about 30 KeV.

6. The micro-electronic device of claim 1 wherein the electron beam exposing step is conducted at an electron dose ranging from about 50 to about 50,000 $\mu C/cm^2$.

7. The micro-electronic device of claim 1 wherein the electron beam exposing step is conducted with a wide, large beam of electron beam radiation from a large-area electron beam source.

8. The micro-electronic device of claim 1 wherein the electron beam exposing step is conducted with a wide, large beam of electron beam radiation from a uniform large-area electron beam source which covers an area of from about 4 square inches to about 256 square inches.

9. The micro-electronic device of claim 1, wherein the metal is selected from the group consisting of aluminum, aluminum alloys, copper, copper alloys, tantalum, tungsten and titanium.

10. A microelectronic device produced by a process which comprises:
    (a) applying a first dielectric layer onto a substrate;
    (b) applying a second dielectric layer onto the first dielectric layer;
    (c) exposing the second dielectric layer to electron beam irradiation under conditions sufficient to cure the second dielectric layer and render the second dielectric layer a polish stop layer while not substantially curing the first dielectric layer;
    (d) imagewise patterning the first and second dielectric layers to form vias in the first and second dielectric layers extending to the substrate;
    (e) depositing a metal into the vias and onto a top surface of the second dielectric layer;
    (f) removing the metal from the top surface of the second dielectric layer.

11. The micro-electronic device of claim 10 wherein the removing of metal from the top surface of the second dielectric layer is conducted by chemical mechanical polishing or etching back the metal on the top surface until the polish stop layer is reached.

12. The micro-electronic device of claim 10 wherein each dielectric layer comprises a silicon containing polymer an alkoxysilane polymer, a silsesquioxane polymer, a siloxane polymer, a poly(arylene ether), a fluorinated poly(arylene ether), a nanoporous silica or combinations thereof.

13. The micro-electronic device of claim 10 wherein the substrate comprises gallium arsenide (GaAs), germanium, silicon, silicon germanium, lithium niobate and compositions containing silicon and combinations thereof.

14. The micro-electronic device of claim 10 wherein the electron beam exposing step is conducted at an energy level ranging from about 1 to about 30 KeV.

15. The micro-electronic device of claim 10 wherein the electron beam exposing step is conducted at an electron dose ranging from about 50 to about 50,000 $\mu C/cm^2$.

16. The micro-electronic device of claim 10 wherein the electron beam exposing step is conducted with a wide, large beam of electron beam radiation from a large-area electron beam source.

17. The micro-electronic device of claim 10 wherein the electron beam exposing step is conducted with a wide, large beam of electron beam radiation from a uniform large-area electron beam source which covers an area of from about 4 square inches to about 256 square inches.

18. The micro-electronic device of claim 10, wherein the metal is selected from the group consisting of aluminum, aluminum alloys, copper, copper alloys, tantalum, tungsten and titanium.

19. A microelectronic device produced by a process which comprises:
(a) applying a first dielectric layer onto a substrate;
(b) exposing the first dielectric layer to electron beam irradiation under conditions sufficient to cure an upper portion of the first dielectric layer and render the upper portion of the first dielectric layer an etch stop layer while not substantially curing a lower portion of the first dielectric layer;
(c) applying a second dielectric layer onto the first dielectric layer;
(d) exposing an upper portion of the second dielectric layer to electron beam irradiation under conditions sufficient to cure the upper portion of the second dielectric layer and render the upper portion of the second dielectric layer a polish stop layer while not substantially curing a lower portion of the second dielectric layer;
(e) imagewise patterning the second dielectric layer to form trenches in the dielectric layers extending to the first dielectric layer;
(f) imagewise patterning the first dielectric layer to form vias in the first dielectric layer extending to the substrate;
(g) depositing a metal into the vias, trenches and onto a top surface of the second dielectric layer;
(h) removing the metal from the top surface of the second dielectric layer.

20. The micro-electronic device of claim 19 wherein the removing of metal from the top surface of the second dielectric layer is conducted by chemical mechanical polishing or etching back the metal on the top surface until the polish stop layer is reached.

21. The micro-electronic device of claim 19 wherein each dielectric layer comprises a silicon containing polymer an alkoxysilane polymer, a silsesquioxane polymer, a siloxane polymer, a poly(arylene ether), a fluorinated poly(arylene ether), a nanoporous silica or combinations thereof.

22. The micro-electronic device of claim 19 wherein the substrate comprises gallium arsenide (GaAs), germanium, silicon, silicon germanium, lithium niobate and compositions containing silicon and combinations thereof.

23. The micro-electronic device of claim 19 wherein the electron beam exposing step is conducted at an energy level ranging from about 1 to about 30 KeV.

24. The micro-electronic device of claim 19 wherein the electron beam exposing step is conducted at an electron dose ranging from about 50 to about 50,000 $\mu C/cm^2$.

25. The micro-electronic device of claim 19 wherein the electron beam exposing step is conducted with a wide, large beam of electron beam radiation from a large-area electron beam source.

26. The micro-electronic device of claim 19 wherein the electron beam exposing step is conducted with a wide, large beam of electron beam radiation from a uniform large-area electron beam source which covers an area of from about 4 square inches to about 256 square inches.

27. The micro-electronic device of claim 19, wherein the metal is selected from the group consisting of aluminum, aluminum alloys, copper, copper alloys, tantalum, tungsten and titanium.

28. A microelectronic device produced by a process which comprises:
(a) applying a first dielectric layer onto a substrate;
(b) applying a second dielectric layer onto the first dielectric layer;
(c) exposing the second dielectric layer to electron beam irradiation under conditions sufficient to cure the second dielectric layer and render the second dielectric layer an etch stop layer while not substantially curing the first dielectric layer;
(d) applying a third dielectric layer onto the second dielectric layer;
(e) applying a fourth dielectric layer onto the third dielectric layer;
(f) exposing the fourth dielectric layer to electron beam irradiation under conditions sufficient to cure the fourth dielectric layer and render the fourth dielectric layer a polish stop layer while not substantially curing the third dielectric layer;
(g) imagewise patterning the third and fourth dielectric layers to form trenches in the third and fourth dielectric layers extending to the second dielectric layer;
(h) imagewise patterning the first and second dielectric layers to form vias in the first and second dielectric layers extending to the substrate;
(i) depositing a metal into the vias, trenches and onto a top surface of the fourth dielectric layer;
(j) removing the metal from the top surface of the fourth dielectric layer.

29. The micro-electronic device of claim 28 wherein the removing of metal from the top surface of the fourth dielectric layer is conducted by chemical mechanical polishing or etching back the metal on the top surface until the polish stop layer is reached.

30. The micro-electronic device of claim 28 wherein the dielectric layer comprises a silicon containing polymer an alkoxysilane polymer, a silsesquioxane polymer, a siloxane polymer, a poly(arylene ether), a fluorinated poly(arylene ether), a nanoporous silica or combinations thereof.

31. The micro-electronic device of claim 28 wherein the substrate comprises gallium arsenide (GaAs), germanium, silicon, silicon germanium, lithium niobate and compositions containing silicon and combinations thereof.

32. The micro-electronic device of claim 28 wherein the electron beam exposing step is conducted at an energy level ranging from about 1 to about 30 KeV.

33. The micro-electronic device of claim 28 wherein the electron beam exposing step is conducted at an electron dose ranging from about 50 to about 50,000 $\mu C/cm^2$.

34. The micro-electronic device of claim 28 wherein the electron beam exposing step is conducted with a wide, large beam of electron beam radiation from a large-area electron beam source.

35. The micro-electronic device of claim 28 wherein the electron beam exposing step is conducted with a wide, large beam of electron beam radiation from a uniform large-area electron beam source which covers an area of from about 4 square inches to about 256 square inches.

36. The micro-electronic device of claim 28, wherein the metal is selected from the group consisting of aluminum, aluminum alloys, copper, copper alloys, tantalum, tungsten and titanium.

37. A microelectronic device produced by a process which comprises:

(a) applying a first dielectric layer onto a substrate;

(b) exposing the first dielectric layer to electron beam irradiation under conditions sufficient to cure an upper portion of the first dielectric layer and render the upper portion of the first dielectric layer an etch stop layer while not substantially curing a lower portion of the first dielectric layer;

(c) imagewise patterning the irradiated portion of the first dielectric layer to form vias extending to the lower portion of the first dielectric layer;

(d) applying a second dielectric layer onto the first dielectric layer;

(e) exposing an upper portion of the second dielectric layer to electron beam irradiation under conditions sufficient to cure the upper portion of the second dielectric layer and render the upper portion of the second dielectric layer a polish stop layer while not substantially curing a lower portion of the second dielectric layer;

(f) imagewise patterning the second dielectric layer to form trenches in the second dielectric layers and vias in the first dielectric layer extending to the substrate;

(g) depositing a metal into the vias, trenches and onto a top surface of the second dielectric layer;

(h) removing the metal from the top surface of the second dielectric layer.

38. A microelectronic device produced by a process which comprises:

(a) applying a first dielectric layer onto a substrate;

(b) applying a second dielectric layer onto the first dielectric layer;

(c) exposing the second dielectric layer to electron beam irradiation under conditions sufficient to cure the second dielectric layer and render the second dielectric layer an etch stop layer while not substantially curing the first dielectric layer;

(d) imagewise patterning the second dielectric layer to form vias extending to the first dielectric layer;

(e) applying a third dielectric layer onto the second dielectric layer;

(f) applying a fourth dielectric layer onto the third dielectric layer;

(g) exposing the fourth dielectric layer to electron beam irradiation under conditions sufficient to cure the fourth dielectric layer and render the fourth dielectric layer a polish stop layer while not substantially curing the third dielectric layer;

(h) imagewise patterning the third and fourth dielectric layers to form trenches in the third and fourth dielectric layers and vias in the first and second dielectric layer extending to the substrate;

(i) depositing a metal into the vias, trenches and onto a top surface of the fourth dielectric layer;

(j) removing the metal from the top surface of the fourth dielectric layer.

* * * * *